United States Patent [19]

Hisa

[11] Patent Number: 5,286,610
[45] Date of Patent: Feb. 15, 1994

[54] METHOD OF PATTERNING ORGANIC MACROMOLECULAR FILM

[75] Inventor: Yoshihiro Hisa, Itami, Japan

[73] Assignee: Mitsubishi Denki Kabushiki Kaisha, Tokyo, Japan

[21] Appl. No.: 863,732

[22] Filed: Apr. 6, 1992

[30] Foreign Application Priority Data

Jul. 24, 1991 [JP] Japan ............................. 3-184567

[51] Int. Cl.$^5$ .............................................. G03C 5/00
[52] U.S. Cl. .................................... 430/325; 430/326; 430/327; 430/324; 430/315; 156/661.1
[58] Field of Search ............... 430/325, 326, 327, 324, 430/315; 156/661.1

[56] References Cited

U.S. PATENT DOCUMENTS 4,889,795  12/1989  Kaifu et al. ........................ 430/325
5,155,060  10/1992  Ikeno et al. ....................... 430/325

Primary Examiner—John Kight, III
Assistant Examiner—Dvc Truong
Attorney, Agent, or Firm—Oblon, Spivak, McClelland, Maier & Neustadt

[57] ABSTRACT

A CEL material (11) is formed such that a first region (11a) thereof which is formed on a concave portion of a semiconductor substrate (1) is sufficiently thicker than a second region (11b) thereof which is formed on the other region. Light (4) is directed from above to the CEL material (11) for a predetermined period of time to render only the thin second region pervious to light to thereby expose part of a photoresist (2) which is under the second region (11b) by the illumination. Subsequently, the semiconductor substrate (1) is immersed in an appropriate solvent to remove only part of the photoresist (2) which is under the first region (11a). The part of the photoresist (2) which is under the second region 11b remains unremoved.

The photoresist (2) can be patterned with the shape of the concave portion of the semiconductor substrate (1) accurately reflected therein.

10 Claims, 10 Drawing Sheets

METHOD OF PATTERNING ORGANIC MACROMOLECULAR FILM

BACKGROUND OF THE INVENTION

1. Field of the Invention

The present invention relates to a method of patterning an organic macromolecular film such as a photoresist.

2. Description of the Background Art

FIGS. 17 to 19 are cross-sectional views showing a conventional method of patterning a photoresist which is formed on a semiconductor substrate having an uneven surface. The method will be discussed hereinafter with reference to FIGS. 17 to 19.

Initially, a semiconductor substrate 1 which has concave portions formed on the surface thereof is coated all over with a negative photoresist 2, as shown in FIG. 17.

As shown in FIG. 18, shade masks 3 are disposed in regions corresponding to the concave portions above the semiconductor substrate 1. Light 4 is directed from above the shade masks 3 to the photoresist 2 to polymerize (expose) only part of the photoresist 2 above which the shade masks are absent and which is formed on the smooth surface of the semiconductor substrate 1.

The semiconductor substrate 1 is immersed in an appropriate solvent, so that only part of the photoresist 2 which is on the concave portions and is not illuminated is removed, and the part of the photoresist 2 which is polymerized by the illumination remains unremoved.

By forming the photoresist 2 only on the region other than the concave portions of the semiconductor substrate 1 by the use of the shade masks 3, a diffusion processing can be performed only on the concave portions of the semiconductor substrate 1. An example of the processing performed on the concave portion of the semiconductor substrate 1 is disclosed in FIG. 5 of Japanese Patent Application Laid-Open No. 62-160776.

The conventional method of the type in which the photoresist 2 is patterned on the region other than the concave portions of the semiconductor substrate has been carried out by disposing the shade masks 3 above the semiconductor substrate 1 and directing light from above the shade masks 3 to the photoresist 2. In this method, however, it is difficult to accurately dispose the shade masks 3 in the regions corresponding to the concave portions of the semiconductor substrate 1. There has been a problem that the organic macromolecular film cannot be accurately patterned in corresponding relation to the concave portions.

Another problem is that, when the light 4 enters under the shade masks 3 as shown in FIG. 20, part of the photoresist 2 which should not be illuminated is polymerized so that the pattern accuracy of the photoresist 2 remarkably deteriorates.

SUMMARY OF THE INVENTION

The present invention is directed to a method of patterning an organic macromolecular film.

In a first aspect of the present invention, the method comprises the steps of preparing a semiconductor substrate having a concave portion, forming on the semiconductor substrate a first organic macromolecular film having a property which changes when exposed to light, forming on the first organic macromolecular film a second organic macromolecular film in an initial state, the second organic macromolecular film having a property of being impervious to light in the initial state and being rendered pervious to light by illumination for a period of time proportional to its film thickness, the second organic macromolecular film including a first region formed on the concave portion and a second region formed on the other region than the concave portion, the first region being thicker than the second region, illuminating the second organic macromolecular film from above for a predetermined period of time to render only the second region of the second organic macromolecular film pervious to light to thereby expose part of the first organic macromolecular film which is under the second region of the second organic macromolecular film, and selectively removing either the exposed region or the unexposed region of the first organic macromolecular film by the use of the property of the first organic macromolecular film.

In a second aspect of the present invention, the method comprises the steps of preparing a semiconductor substrate having a concave portion, forming a layer on the bottom face of the concave portion, forming a positive photoresist over the semiconductor substrate and the layer, forming on the photoresist an organic macromolecular film in an initial state, the organic macromolecular film having a property of being impervious to light in the initial state and being rendered pervious to light by illumination for a period of time proportional to its film thickness, the organic macromolecular film including a first region formed on a side face of the concave portion and a second region formed on the other region, the first region being thicker than the second region, illuminating the organic macromolecular film from above to render the second region of the organic macromolecular film pervious to light to thereby expose part of the photoresist which is under the second region of the organic macromolecular film, and selectively removing the exposed region of the photoresist with the layer left unremoved.

According to the method in the first aspect of the present invention, by the use of the difference in film thickness between the first region of the second organic macromolecular film which is formed on the concave portion of the semiconductor substrate and the second region thereof which is formed on the other region than the concave portion, the second organic macromolecular film is illuminated from above for the predetermined period of time to render only the second region of the second organic macromolecular film pervious to light to thereby expose the part of the first organic macromolecular film which is under the second region of the second organic macromolecular film. Only the region of the first organic macromolecular film which is formed on the other region than the concave portion of the semiconductor substrate is accurately exposed. This enables the accurate patterning of the first organic macromolecular film on the concave portion and other region of the semiconductor substrate.

According to the method in the second aspect of the present invention, by the use of the difference in film thickness between the first region of the organic macromolecular film which is formed on the side face of the concave portion of the semiconductor substrate and the second region thereof which is formed on the other region than the side face of the concave portion, the organic macromolecular film is illuminated from above for the predetermined period of time to render only the second region of the organic macromolecular film pervious to light to thereby expose the part of the positive photoresist which is under the second region of the organic macromolecular film. Only the region of the photoresist which is formed on the other region than the side face of the concave portion of the semiconductor substrate is accurately exposed. The layer is previously formed on the bottom face of the concave portion. This enables the accurate patterning of the resist which includes the remaining layer and the photoresist on the concave portion and other region of the semiconductor substrate.

An object of the present invention is to provide a method of patterning an organic macromolecular film in which the organic macromolecular film such as a photoresist formed on a semiconductor substrate having a concave portion can be formed with a pattern which accurately reflects the concave portion.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 13:
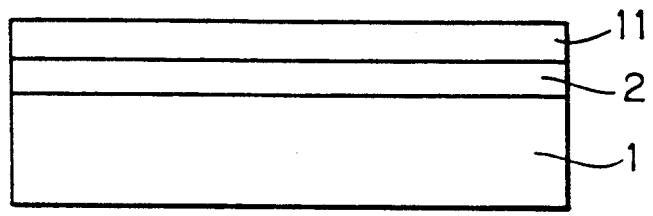
FIGS. 13 to 16 are cross-sectional views showing the property of a CEL material.

With reference to the cross sections of FIGS. 13 to 16, discussed below is the property of a contrast enhancement layer (CEL material) employed in the preferred embodiments of the present invention. As shown in FIG. 13, a negative photoresist 2 is formed on a semiconductor substrate 1 and, subsequently, a CEL material 11 in the initial state is formed on the photoresist 2. The CEL material 11 in the initial state is impervious to light.

Figure 14:
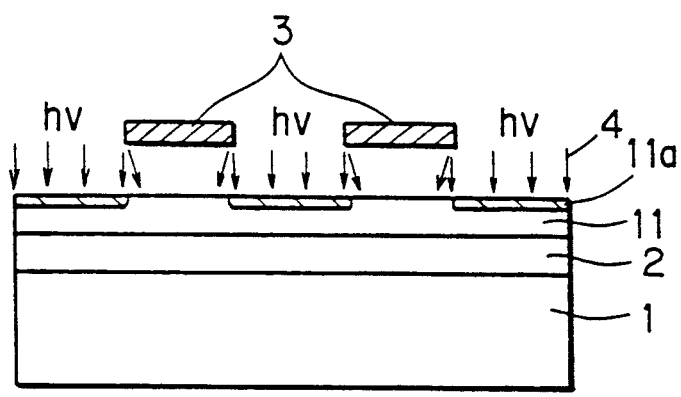
Figure 15:
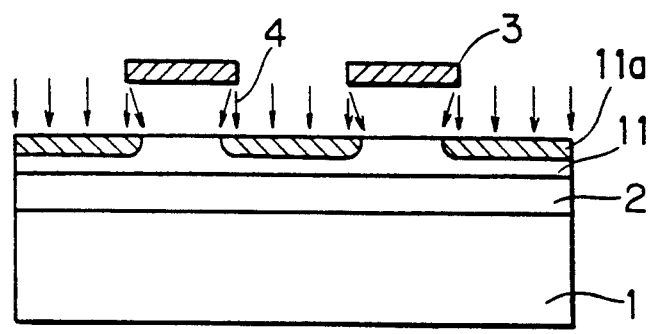

Shade masks 3 are disposed in predetermined regions above the semiconductor substrate 1, as shown in FIG. 14. Light 4 is directed from above the shade masks 3 to the CEL material 11. This provides for change in the composition of the CEL material 11 in the regions above which the shade masks 3 are absent (as indicated by the oblique lines in FIG. 14) so that the regions of the CEL material 11 are rendered pervious to light.

Figure 16:
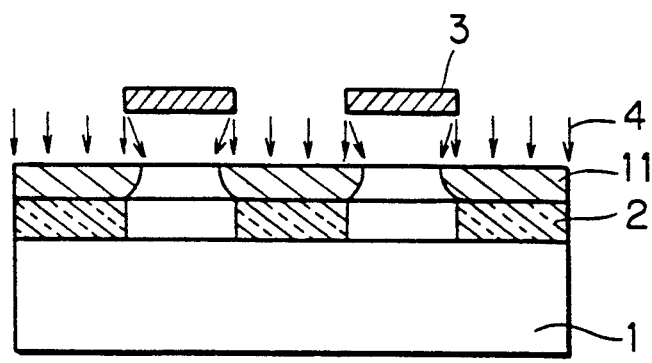
Figure 17:
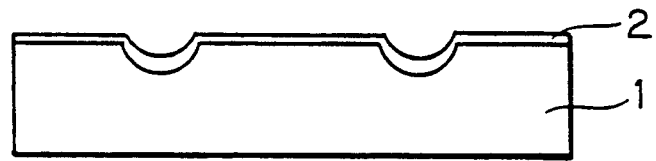
FIGS. 17 to 19 are cross-sectional views showing a conventional method of patterning the photoresist.
Figure 18:
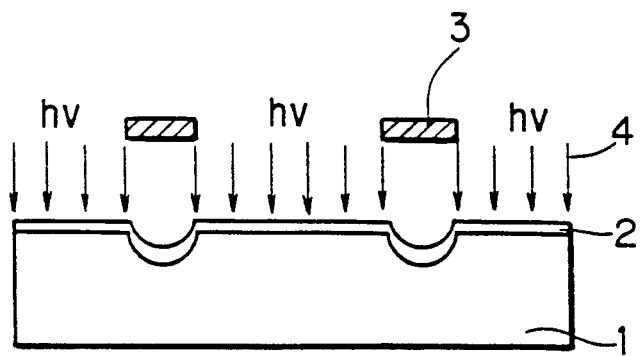
Figure 19:
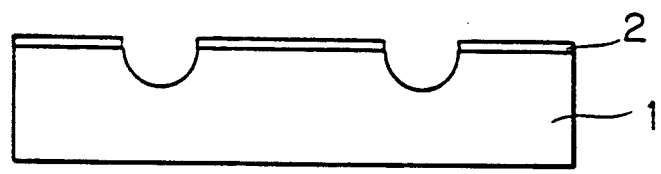
Figure 20:
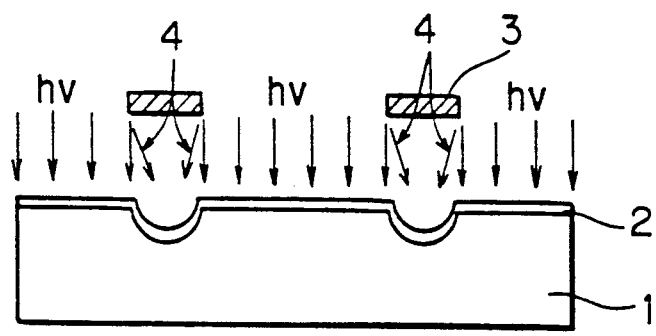
FIG. 20 is a cross-sectional view showing a problem of the conventional method.

By the continuous illumination of the light 4, the change in the composition of the CEL material 11 in the regions above which the shade masks 3 are absent proceeds in the depth direction. When the change finally proceeds to the reverse face of the CEL material 11 as shown in FIG. 16, part of the photoresist which is formed under the regions of the CEL material 11 is exposed.

The CEL material 11 is impervious to light in the initial state. The change in the composition of the CEL material 11 proceeds in the depth direction by illumination, until the CEL material 11 is rendered pervious to light after the illumination for a predetermined period of time or more. That is, the CEL material 11 has the property of being impervious to light in the initial state and being rendered pervious to light after the illumination for a period of time proportional to its film thickness.

Figure 1:
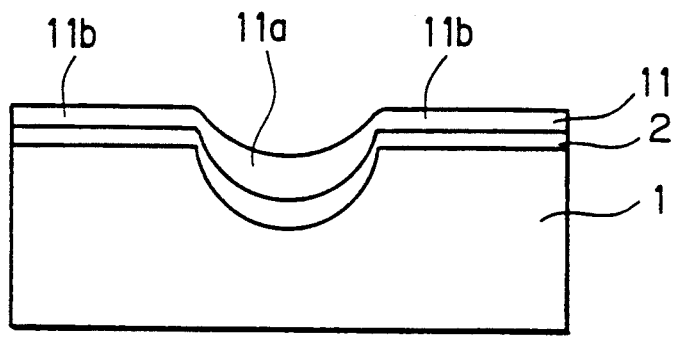
FIGS. 1 to 3 are cross-sectional views showing a method of patterning a photoresist according to a first preferred embodiment of the present invention.
Figure 2:
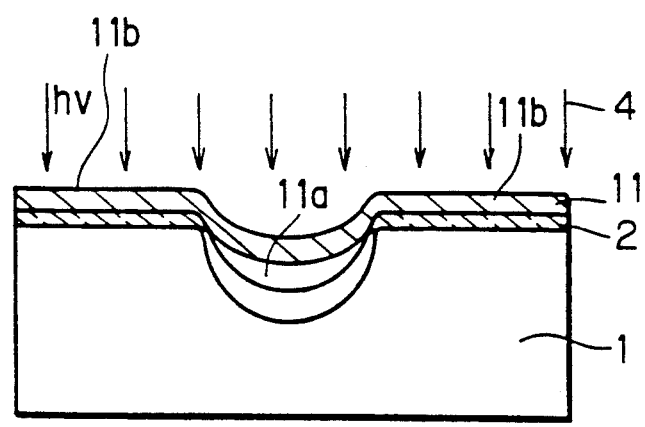
Figure 3:
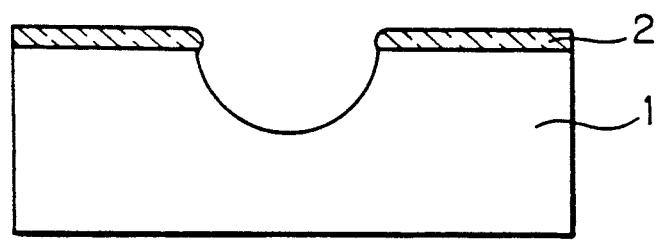

FIGS. 1 to 3 are cross-sectional views showing a method of patterning the photoresist to be formed on the semiconductor substrate 1 having a concave portion according to a first preferred embodiment of the present invention. The method will be described below with reference to FIGS. 1 to 3.

The semiconductor substrate 1 which has the concave portion formed on the surface thereof is coated all over with the negative photoresist 2 by means of a spin coater, as shown in FIG. 1. The photoresist 2 is coated with the CEL material 11 by means of the spin coater.

The CEL material 11 is formed such that a first region 11a of the CEL material 11 which is formed on the concave portion of the semiconductor substrate 1 is sufficiently thicker than a second region 11b of the CEL material 11 which is formed on a flat surface portion of the semiconductor substrate 1. The film thicknesses of the first and second regions 11a and 11b can be independently changed with high accuracy by respectively changing the number of spins of the spin coater, the time period of spins, and the viscosity of the CEL material 11 by the use of the difference in shape between parts of the semiconductor substrate 1 which are under the first and second regions 11a and 11b, respectively. For example, as the number of spins of the spin coater is increased, the film thickness of the second region 11b becomes small. As the viscosity of the CEL material 11 grows strong, the difference in film thickness between the first and second regions 11a and 11b grows large.

As shown in FIG. 2, the light 4 is directed from above to the CEL material 11 for a predetermined period of time. The composition of the CEL material 11 is changed by the illumination in the depth direction from its surface. The CEL material 11 is gradually rendered pervious to light, until the second region 11b of the CEL material 11 transmits light to the photoresist 2 formed thereunder, so that part of the photoresist 2 which is under the second region 11b of the CEL material 11 is polymerized (exposed) by the illumination. Since the first region 11a of the CEL material 11 is sufficiently thick so that the change in composition does not proceed to the reverse face thereof, part of the photoresist 2 which is under the first region 11a of the CEL material 11 is not illuminated.

The semiconductor substrate 1 is immersed in an appropriate solvent (developer) to remove only the part of the photoresist 2 which is under the first region 11a of the CEL material 11 and is not illuminated, that is, part of the photoresist 2 which is on the concave portion of the semiconductor substrate 1, as shown in FIG. 3. The part of the photoresist 2 which is under the second region 11b of the CEL material 11 and is exposed by the illumination, that is, part of the photoresist 2 which is on the flat surface portion of the semiconductor substrate 1 remains unremoved. As a result, the photoresist 2 is patterned with the shape of the concave portion of the semiconductor substrate 1 accurately reflected therein.

As described above, the CEL material 11 is formed such that the first region 11a of the CEL material 11 which is formed on the concave portion of the semiconductor substrate 1 is sufficiently thicker than the second region 11b of the CEL material 11 which is formed on the flat surface portion of the semiconductor substrate 1. After the illumination for the predetermined period of time, the semiconductor substrate 1 is immersed in the solvent to accurately form the photoresist 2 only on the flat surface portion of the semiconductor substrate 1. Thereafter, processings can be performed on the concave portion of the semiconductor substrate 1. The processings are, for example, the selective removal of a passivation film (not shown in FIGS. 1 to 3, however, formed between the semiconductor substrate 1 and the photoresist 2) under the photoresist 2 by using the remaining photoresist 2 as a mask, to make a contact hole and the formation of electrodes thereafter.

Figure 4:
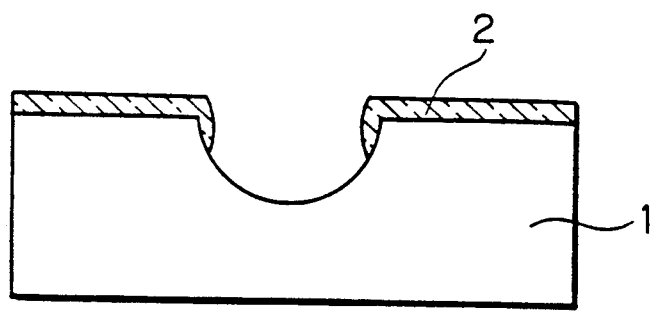
FIG. 4 is a cross-sectional view showing a modification of the first preferred embodiment.

The CEL material 11 is formed such that the film thickness thereof on the opening edge of the concave portion of the semiconductor substrate 1 is smaller than that on the other region. By the use of this property of the CEL material 11, the change in the composition of both parts of the CEL material 11 which are formed on the flat surface portion and on the opening edge of the concave portion can be made to proceed to the reverse surface by prolonging the period of time for illumination. This enables the patterning with the photoresist 2 left unremoved also on the opening edge of the concave portion of the semiconductor substrate 1 as shown in FIG. 4.

Figure 5:
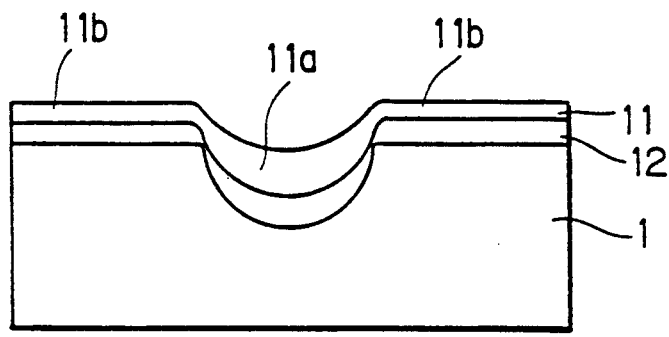
FIGS. 5 to 7 are cross-sectional views showing the method according to a second preferred embodiment of the present invention.
Figure 6:
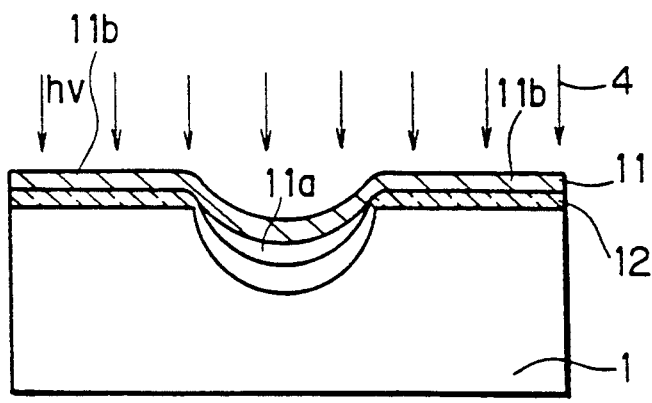
Figure 7:
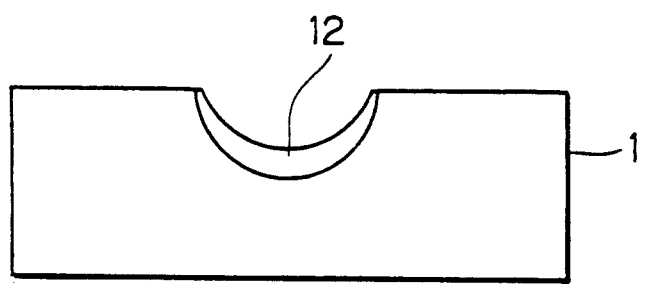

FIGS. 5 to 7 are cross-sectional views showing the method of patterning the photoresist to be formed on the semiconductor substrate 1 having the concave portion according to a second preferred embodiment of the present invention. The method will be described with reference to FIGS. 5 to 7.

As shown in FIG. 5, the semiconductor substrate 1 which has the concave portion formed on the surface thereof is coated all over with a positive photoresist 12 by means of the spin coater. The photoresist 12 is coated with the CEL material 11 by means of the spin coater.

The CEl material 11 is formed such that the first region 11a of the CEL material 11 which is formed on the concave portion of the semiconductor substrate 1 is sufficiently thicker than the second region 11b of the CEL material 11 which is formed on the flat surface portion of the semiconductor substrate 1. The film thicknesses of the first and second regions 11a and 11b can be independently changed with high accuracy by respectively changing the number of spins of the spin coater, the time period of spins and the viscosity of the CEL material 11 by the use of the difference in shape between the parts of the semiconductor substrate 1 which are under the first and second regions 11a and 11b, respectively, similarly to the first preferred embodiment.

As shown in FIG. 6, the light 4 is directed from above to the CEL material 11 for a predetermined period of time. The composition of the CEL material 11 is changed by the illumination in the depth direction from its surface, so that the CEL material 11 is gradually rendered pervious to light. The second region 11b of the CEL material 11 comes to transmit light to the photoresist 12 formed thereunder, so that part of the photoresist 12 which is under the second region 11b of the CEL material 11 is polymerized by the illumination. Since the first region 11a of the CEL material 11 is sufficiently thick so that the change in composition does not proceed to the reverse face thereof, part of the photoresist 12 which is under the first region 11a of the CEL material 11 is not illuminated.

The semiconductor substrate 1 is immersed in an appropriate solvent to remove only the part of the photoresist 12 which is under the first region 11a of the CEL material 11 and is polymerized by the illumination, that is, part of the photoresist 12 which is on the flat surface portion of the semiconductor substrate 1, as shown in FIG. 7. The part of the photoresist 12 which is under the second region 11b of the CEL material 11 and is not illuminated, that is, part of the photoresist 12 which is on the concave portion of the semiconductor substrate 1 remains unremoved.

As described above, the CEL material 11 is formed such that the first region 11a of the CEL material 11 which is formed on the concave portion of the semiconductor substrate 1 is sufficiently thicker than the second region 11b of the CEL material 11 which is formed on the flat surface portion of the semiconductor substrate 1. The CEL material 11 is illuminated for a predetermined period of time. This provides for the patterning with the photoresist 12 accurately left unremoved only on the concave portion of the semiconductor substrate 1.

In the application of the second preferred embodiment, the concave portion of the semiconductor substrate 1 can be levelled with the surface thereof. The processing of the second preferred embodiment is repeated until the concave portion is levelled with the surface, resulting in the semiconductor substrate 1 having no concave portion but the level surface.

When an epitaxial layer is formed by means of a liquid phase epitaxial growth technique, for example, it is difficult to form the epitaxial layer having no concave portion but the level surface. Accordingly, it is difficult to form an electrode wiring pattern on the epitaxial layer with high accurately.

However, when the method of patterning the photoresist in the second preferred embodiment is applied to the epitaxial layer having the rough surface, the surface of the epitaxial layer can be easily levelled by filling in the concave portion on the surface of the epitaxial layer with the photoresist. The electrode wiring pattern can be formed on the epitaxial layer with high accuracy. This provides for an increased yield and a large reduction in production costs.

Figure 8:
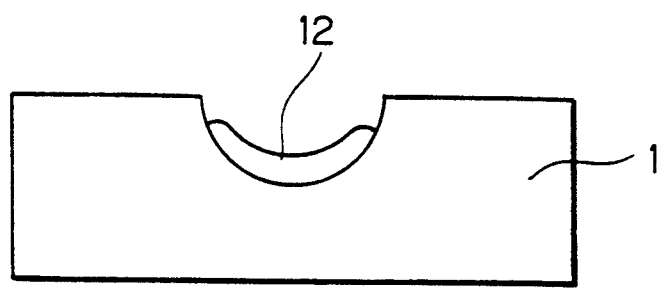
FIG. 8 is a cross-sectional view showing a modification of the second preferred embodiment.

The CEL material 11 is formed such that the film thickness thereof on the opening edge of the concave portion of the semiconductor substrate 1 is smaller than that on the other region. By the use of this property of the CEL material 11, in the application of the second preferred embodiment, the change in the composition of both parts of the CEL material 11 which are formed on the flat surface portion and on the opening edge of the concave portion can be made to proceed to the reverse surface by prolonging the period of time for illumination. This enables the patterning with the photoresist 12 left unremoved only on the concave portion of the semiconductor substrate 1 except the opening edge thereof as shown in FIG. 8.

When the concave portion of the semiconductor substrate 1 has a large base area, it is easy to form the CEL material 11 such that the film thickness thereof on the side face of the concave portion is larger than that on the flat surface portion of the semiconductor substrate 1. However, it has been experimentally found that it is difficult to form the CEL material 11 such that the film thickness thereof on the bottom face of the concave portion is larger than that on the flat surface portion of the semiconductor substrate 1 because the bottom face is normally flat. A third preferred embodiment of the present invention described later enables the photoresist to be accurately formed on the concave portion when the concave portion of the semiconductor substrate 1 has the large base area.

FIGS. 9 to 12 are cross-sectional views showing the method of patterning the photoresist to be formed on the semiconductor substrate which includes the concave portion having the large base area according to a third preferred embodiment of the present invention. The method will be described below with reference to FIGS. 9 to 12.

Figure 9:
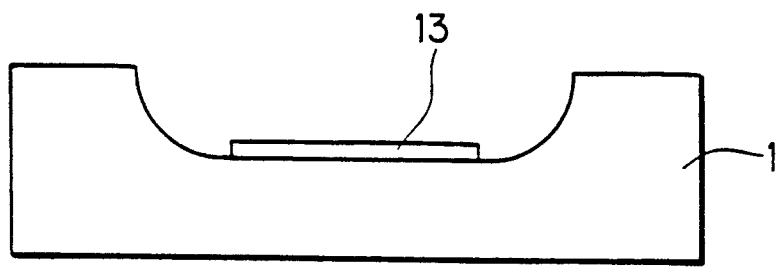
FIGS. 9 to 12 are cross-sectional views showing the method according to a third preferred embodiment of the present invention.

As shown in FIG. 9, an exposed negative photoresist 13 is formed on the bottom face of the concave portion of the semiconductor substrate 1. The formation position accuracy of the photoresist 13 need not be so high in this case.

Figure 10:
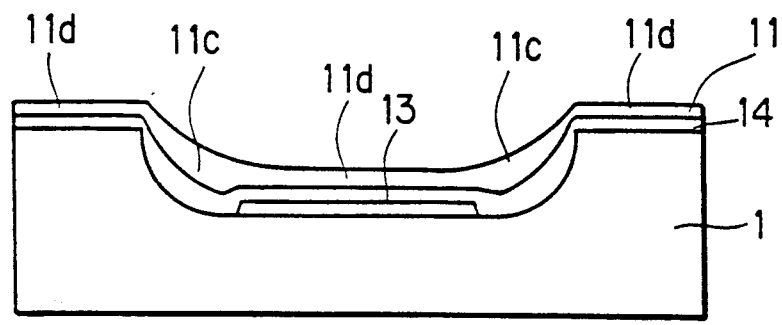

As shown in FIG. 10, the semiconductor substrate 1 is coated all over with a positive photoresist 14 by means of the spin coater. The positive photoresist 14 is coated with the CEL material 11 by means of the spin coater. The CEL material is formed such that a first region 11c of the CEL material 11 which is formed on the side face of the concave portion of the semiconductor substrate 1 is sufficiently thicker than a second region 11d of the CEL material 11 which is the other region.

Figure 11:
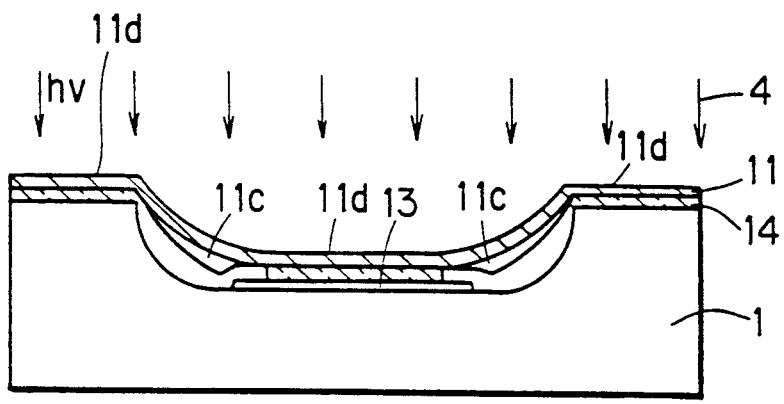

As shown in FIG. 11, the light 4 is directed from above to the CEL material 11 for a predetermined period of time. The composition of the CEL material 11 is changed by the illumination in the depth direction from its surface, so that the CEL material 11 is rendered pervious to light (indicated by the oblique lines in FIG. 11). The second region 11d of the CEL material 11 which is formed on the flat surface portion and on the bottom face of the concave portion of the semiconductor substrate 1 comes to transmit light to the positive photoresist 14 formed thereunder, so that only part of the positive photoresist 14 which is formed on the flat surface portion and on the bottom face of the concave portion of the semiconductor substrate 1 is polymerized by the illumination. Since the first region 11c of the CEL material 11 which is formed on the side face of the concave portion of the semiconductor substrate 1 is sufficiently thick so that the change in composition does not proceed to the reverse face thereof, part of the positive photoresist 14 which is on the side face of the concave portion of the semiconductor substrate 1 is not illuminated.

Figure 12:
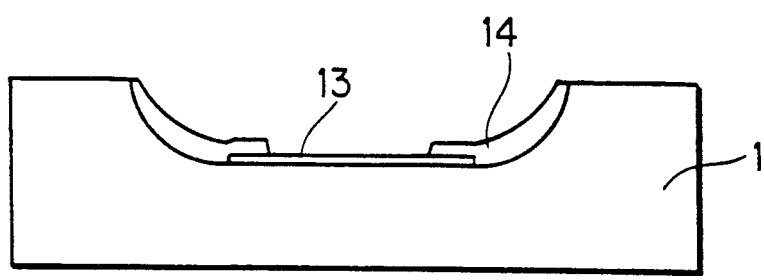

The semiconductor substrate 1 is immersed in an appropriate solvent to remove part of the photoresist 14 which is on the flat surface portion of the semiconductor substrate 1 and is polymerized by the illumination, as shown in FIG. 12. The exposed negative photoresist 13 and the part of the photoresist 14 which is on the side face of the concave portion of the semiconductor substrate 1 and which is not illuminated remain unremoved.

As described above, after the negative photoresist 13 is formed on the bottom face of the concave portion of the semiconductor substrate 1 in advance, the CEL material 11 is formed such that the first region 11c of the CEL material 11 which is formed on the side face of the concave portion of the semiconductor substrate 1 is sufficiently thicker than the second region 11d of the CEL material 11 which is formed on the other region. The semiconductor substrate 1 is immersed in the solvent after the illumination for the predetermined period of time, to form the positive photoresist 14 only on the side face of the concave portion of the semiconductor substrate 1. This provides for the reliable formation of one or both of the photoresists 13 and 14 on the concave portion of the semiconductor substrate 1 which might have the large base area. The negative photoresist 13 may be made of other material which is insoluble at the time of the removal of the exposed positive photoresist 14.

According to the first to third preferred embodiments, the photoresist can be formed with the pattern which accurately reflects the concave portion.

To increase the value of capacitance while improving integration in the formation of a semiconductor device of hereto structure, it is necessary to make a hole of several micrometers in depth on the surface of the semiconductor substrate or to partially remove the surface layer of the hetero structure.

In this case, a low accuracy in the shape of the concave portion formed on the semiconductor substrate causes the shade mask to deviate from the position corresponding to the concave portion in the conventional patterning method using the shade mask. The different accuracies in the shape of the concave portion between the inside and outside of the semiconductor chip also cause the same problem.

When the shade mask deviates from the position corresponding to the concave portion, the patterning accuracy of the photoresist is deteriorated, resulting in the decreased yield of the semiconductor devices formed on the semiconductor substrate.

In the present invention, however, the photoresist can be patterned with the concave portion accurately reflected therein without the use of the shade mask, independently of the accuracy in the shape of the concave portion. This permits improvements in the patterning accuracy of the photoresist and in the yield of the semiconductor devices formed on the semiconductor substrate.

The negative photoresist employed in the preferred embodiments is OMR83 (made by Tokyo Ohka Kogyo Co., Ltd.), for example. The solvent (developer) thereof is OMR developer G (made by the same). The positive photoresist is S1400 (made by Shipley Far East Co., Ltd.), for example. The solvent thereof is MF-321 (made by the same). The CEL material is CEM-420 (made by General Electric Company in U.S.A.), for example.

The sensitivities of OMR83, S1400 and CEM-420 are 16 mJ/cm$^2$, 30 mJ/cm$^2$ and 9 mJ/cm$^2$, respectively. In general, the sensitivity (decolorization rate) of the CEL material is preferably smaller than the sensitivity (polymerization rate) of the photoresist. In practice, however, it is preferable to select the CEL material optimal for the present invention in consideration of the sensitivity of the CEF material, the absorption coefficient of light and the film thickness.

In the preferred embodiments, the organic macromolecular film to be patterned is the photoresist. However, substitutable is an organic macromolecular film whose property in an exposed region is different from that in an unexposed region and in which one of the regions can be selectively removed by immersing it in a solvent by the use of the properties, such as a polyimide film and the like.

In the preferred embodiments, the CEL material is used as the organic macromolecular film which has the property of being impervious to light in the initial state and being rendered pervious to light by the illumination for the period of time proportional to its film thickness. The present invention is not restricted to this, and other organic macromolecular films having the similar property are substitutable.

While the invention has been shown and described in detail, the foregoing description is in all aspects illustrative and not restrictive. It is therefore understood that numerous modifications and variations can be devised without departing from the scope of the invention.

What is claimed is:

1. A method of patterning an organic macromolecular film comprising the steps of preparing a semiconductor substrate having a concave portion, forming on said semiconductor substrate a first organic macromolecular film having a property which changes when exposed to light, forming on said first organic macromolecular film a second organic macromolecular film in an initial state, said second organic macromolecular film having a property of being impervious to light in the initial state and being rendered pervious to light by illumination for a period of time proportional to its film thickness, said second organic macromolecular film including a first region formed on said concave portion and a second region formed on the other region than said concave portion, said first region being thicker than said second region, illuminating said second organic macromolecular film from above for a predetermined period of time to render only said second region of said second organic macromolecular film pervious to light to thereby expose part of said first organic macromolecular film which is under said second region of said second organic macromolecular film, and selectively removing either the exposed region or the unexposed region of said first organic macromolecular film by the use of the property of said first organic macromolecular film.

2. The method of claim 1, wherein said first organic macromolecular film is a photoresist.

3. The method of claim 2, wherein said photoresist is negative.

4. The method of claim 2, wherein said photoresist is positive.

5. The method of claim 1, wherein said second organic macromolecular film is a contrast enhancement layer (CEL material).

6. A method of patterning an organic macromolecular film comprising the steps of preparing a semiconductor substrate having a concave portion, forming on said semiconductor substrate a first organic macromolecular film having a property which changes when exposed to light, forming on said first organic macromolecular film a second organic macromolecular film in an initial state, said second organic macromolecular film having a property of being impervious to light in the initial state and being rendered pervious to light by illumination for a period of time proportional to its film thickness, said second organic macromolecular film including a first region formed on said concave portion and a second region formed on the other region than said concave portion, said first region being thicker than said second region, part of said first region which is on an opening edge of said concave portion being thinner than the other part of said first region, illuminating said second organic macromolecular film from above for a predetermined period of time to render said second region of said second organic macromolecular film and a third region that is the part of said first region which is on the opening edge of said concave portion pervious to light, to thereby expose part of said first organic macromolecular film which is under said second and third regions of said second organic macromolecular film, and selectively removing either the exposed region or the unexposed region of said first organic macromolecular film by the use of the property of said first organic macromolecular film.

7. A method of patterning an organic macromolecular film comprising the steps of preparing a semiconductor substrate having a concave portion, forming a layer on the bottom face of said concave portion, forming a positive photoresist over said semiconductor substrate and said layer, forming on said photoresist an organic macromolecular film in an initial state, said organic macromolecular film having a property of being impervious to light in the initial state and being rendered pervious to light by illumination for a period of time proportional to its film thickness, said organic macromolecular film including a first region formed on a side face of said concave portion and a second region formed on the other region, said first region being thicker than said second region, illuminating said organic macromolecular film from above to render said second region of said organic macromolecular film pervious to light to thereby expose part of said photoresist which is under said second region of said organic macromolecular film, and selectively removing the exposed region of said photoresist with said layer left unremoved.

8. The method of claim 7, wherein said layer is an exposed negative photoresist.

9. The method of claim 7, wherein said organic macromolecular film is a contrast enhancement layer (CEL material).

10. The method of claim 7, wherein said concave portion has a relatively large flat region formed on the bottom face thereof.

* * * * *